(12) United States Patent
Jaggers

(10) Patent No.: US 11,864,344 B2
(45) Date of Patent: Jan. 2, 2024

(54) CHASSIS AS A COMMON COOLING SOLUTION FOR DIE PACKAGES

(71) Applicant: ADVANCED MICRO DEVICES, INC., Santa Clara, CA (US)

(72) Inventor: Christopher M. Jaggers, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/485,966

(22) Filed: Sep. 27, 2021

(65) Prior Publication Data
US 2023/0098181 A1 Mar. 30, 2023

(51) Int. Cl.
*H05K 7/20* (2006.01)
*G06F 1/18* (2006.01)
*G06F 1/20* (2006.01)

(52) U.S. Cl.
CPC ......... *H05K 7/20263* (2013.01); *G06F 1/182* (2013.01); *H05K 7/20254* (2013.01); *G06F 1/203* (2013.01)

(58) Field of Classification Search
CPC ............ H05K 7/20263; H05K 7/20254; G06F 1/182; G06F 1/203
See application file for complete search history.

(56) References Cited

U.S. PATENT DOCUMENTS

| | | | | |
|---|---|---|---|---|
| 6,084,769 A | * | 7/2000 | Moore | G06F 1/203 361/679.52 |
| 6,453,378 B1 | * | 9/2002 | Olson | G06F 1/203 361/679.55 |
| 2002/0085350 A1 | * | 7/2002 | Ghosh | G06F 1/203 361/679.53 |
| 2003/0011983 A1 | * | 1/2003 | Chu | G06F 1/203 361/679.47 |
| 2007/0263352 A1 | * | 11/2007 | Jones | H05K 7/20418 361/688 |
| 2008/0151503 A1 | * | 6/2008 | Aapro | H04M 1/026 361/714 |
| 2009/0113105 A1 | * | 4/2009 | Mok | G06F 1/3203 710/304 |
| 2014/0352926 A1 | * | 12/2014 | Sun | G06F 1/203 165/104.26 |
| 2015/0138722 A1 | * | 5/2015 | French, Jr. | H05K 7/20254 165/104.31 |
| 2015/0300750 A1 | * | 10/2015 | Tan | G06F 1/203 361/679.52 |
| 2015/0327400 A1 | * | 11/2015 | Wang | G06F 1/1632 361/696 |
| 2016/0088762 A1 | * | 3/2016 | Wu | G06F 1/203 165/80.2 |
| 2017/0055367 A1 | * | 2/2017 | Shen | G06F 1/1626 |
| 2017/0055379 A1 | * | 2/2017 | Shen | G06F 1/1656 |
| 2018/0284855 A1 | * | 10/2018 | North | G06F 1/203 |
| 2019/0324507 A1 | * | 10/2019 | Carbone | H05K 7/20336 |

* cited by examiner

*Primary Examiner* — Michael A Matey

(57) ABSTRACT

A computing device chassis for a common cooling solution for die packages comprising: a chassis base comprising: an internal cavity; a cooling element housed in the internal cavity; and one or more thermal interfaces to the cooling element.

20 Claims, 5 Drawing Sheets

CHASSIS AS A COMMON COOLING SOLUTION FOR DIE PACKAGES

BACKGROUND

Computing devices implement one or more cooling elements to transfer and dissipate heat generated by various components, including processors, graphics processing units (GPUs), and the like. Such cooling elements include, for example, fluid-cooled systems (e.g., water-cooled systems), heat pipes, vapor chambers, heat sinks, fans, and the like.

DETAILED DESCRIPTION

Figure 1:
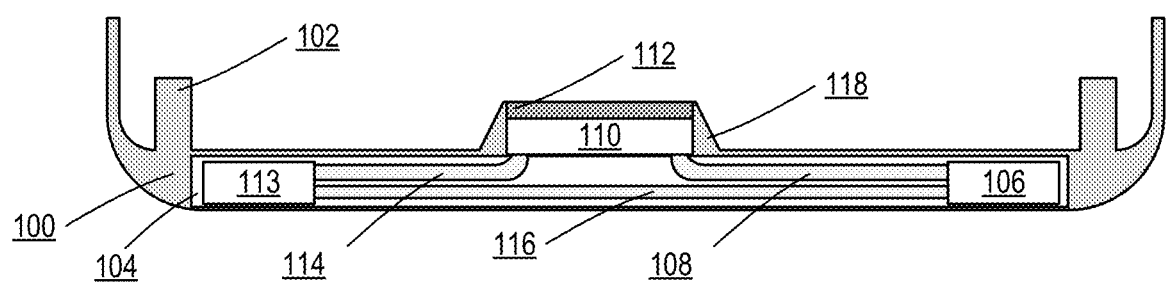
FIG. 1 is a diagram of an example base for a chassis utilized as a common cooling solution for die packages according to some implementations.

For mobile computing devices (e.g., laptops, tablets, hybrid laptop/tablets, and the like), the amount of internal space available for components, such as cooling elements, is limited. Some cooling elements require more components or use more volume compared to other cooling elements. Typically, internal chassis space must be sacrificed in order to use these larger or more voluminous cooling elements, making that internal chassis space unavailable for functional components of the mobile computing device such as boards, chips, peripheral devices, and the like.

To that end, various implementations of a computing device chassis utilized as a common cooling solution for die packages are described in this specification. Some implementations of such a computing device chassis include a chassis base that, in turn, includes an internal cavity, a cooling element housed in the internal cavity, and one or more thermal interfaces to the cooling element.

In some implementations, the cooling element housed in the internal cavity of the chassis base includes a liquid-cooled cooling element. In some implementations, the one or more thermal interfaces include a water plate. In some implementations, the chassis base includes a unibody chassis base. In some implementations, the chassis base also includes one or more pedestal structures and the thermal interfaces are housed in one or more portions of the internal cavity in the one or more pedestal structures. In some implementations, the one or more thermal interfaces are thermally coupled to one or more die packages. In some implementations, the one or more die packages include an application processing unit (APU) die package. In some implementations, the one or more die packages include a discrete graphics processing unit (dGPU) die package. In some implementations, the one or more thermal interfaces are thermally coupled to one or more die packages via one or more portions of thermal interface material.

Also described in this specification are various implementations of a mobile computing devices that includes a common cooling solution. In some implementations, the mobile computing devices includes a plurality of die packages and a chassis having a chassis base. The chassis base includes an internal cavity, a cooling element housed in the internal cavity, and one or more thermal interfaces to the cooling element. At least one of die packages is located within the internal cavity of the chassis base and is thermally coupled to the cooling element through at least one of the thermal interfaces.

In some implementations, the cooling element of the chassis base of the mobile computing device includes a liquid-cooled cooling element. In some implementations, the one or more thermal interfaces include a water plate. In some implementations, the chassis base includes a unibody chassis base. In some implementations, the chassis base also includes one or more pedestal structures and the one or more thermal interfaces are housed in one or more portions of the internal cavity in the one or more pedestal structures. In some implementations, the mobile computing device includes one or more die packages thermally coupled to the one or more thermal interfaces. In some implementations, the one or more die packages include an APU die package. In some implementations, the one or more die packages include a dGPU die package. In some implementations, the one or more thermal interfaces are thermally coupled to one or more die packages via one or more portions of thermal interface material.

Also described in this specification is a method for utilizing a chassis as a common cooling solution for die packages. In various implementations, the method includes thermally coupling one or more die packages to one or more thermal interfaces housed within a chassis base of a computing device chassis. The method also includes performing, via the one or more thermal interfaces, a thermal transfer between the one or more die packages and a cooling element housed within an internal cavity of the chassis base.

In some implementations of the method, the chassis base also includes one or more pedestal structures and the one or more thermal interfaces are housed in one or more portions of the internal cavity in the one or more pedestal structures.

Various implementations of a chassis utilized as a common cooling solution for die packages are described with reference to drawings beginning with FIG. 1. FIG. 1 is a diagram of a non-limiting example chassis base 100 for a chassis as a common cooling solution for die packages according to some implementations of the present disclosure. The example chassis base 100 of FIG. 1 is shown in a cross-sectional view. The example chassis base 100 can be implemented in the chassis of a variety of mobile computing devices, including laptops, tablets, hybrid laptop/tablet computing devices, mobile phones, and other mobile computing devices as can be appreciated. As described herein, the chassis of a mobile computing device is a case or enclosure that houses the functional components of the mobile computing device. For example, a laptop device will include a chassis for housing processing components, storage, memory, and the like, as well as for housing a keyboard, touchpad, or other input devices. The laptop device will also include another chassis for housing a display or monitor, with the two chassis coupled via hinges or other interconnects. As another example, a tablet device will include a single chassis for housing processing components, storage, memory, and the like, with a display effectively forming a surface of the chassis in order to contain the internal components.

Accordingly, in some implementations, the chassis base 100 is a bottom portion of a shell or casing for housing the internal components of a mobile computing device. In some implementations, the chassis base 100 will be combined with a chassis top (not shown) that houses a keyboard or other input devices, thereby forming an internal chamber for housing the internal components of the mobile computing device. In other implementations, the chassis base 100 will be combined with a display to form a tablet computing device.

The chassis base 100 is composed of a suitably rigid material to provide protection and stable housing for the internal components of a computing device. For example, the chassis base 100 is composed of a rigid plastic, a metal such as aluminum, or another material as can be appreciated. In some implementations, the chassis base 100 is constructed using a unibody construction surrounding an internal cavity 104 described in further detail below.

The chassis base 100 includes one or more attachment points 102. The attachment points 102 are holes (e.g., screw holes), recesses, pegs, and the like that facilitate the attachment and mounting of internal components of a mobile computing devices. For example, in some implementations, the attachment points 102 are used to attach a skeleton or internal support structure to which the functional internal components (e.g., motherboards, storage devices, peripheral devices, power supplies, and the like) are attached. As another example, in some implementations, the attachment points 102 are used to directly attach an internal component. For example, a motherboard or other circuit board can be directly attached to the chassis base 100 via the attachment points 102.

The chassis base 100 includes an internal cavity 104. Housed within the internal cavity 104 is a cooling element. A cooling element is one or more components that channel or dissipate heat generated by an internal component of a computing device to which the cooling element is thermally coupled. For example, the cooling element includes liquid cooling systems, heat sinks, fans, heat pipes, vapor chambers, radiator fins, or combinations thereof.

In the example chassis base 100, the cooling element includes a liquid cooling system including a pump 106. The pump 106 pumps a cooling liquid (e.g., water) via a cooling liquid channel 108. The cooling liquid channel 108 is an insulated pipe, tube, or other sealed channel for delivering cooling liquid to a heat exchange chamber 110. The heat exchange chamber 110 is a cavity or chamber where the cooling liquid is heated by transferring heat from an internal component of the computing device thermally coupled to the heat exchange chamber 110.

A thermal interface 112 is used to thermally couple internal components of the computing device to the cooling element. The thermal interface 112 is a portion of conductive material such as aluminum, copper, or another conductive metal. In this example, the thermal interface 112 is a water plate of a liquid cooling system. Thus, a component thermally coupled to the water plate will transfer heat into the heat exchange chamber 110. In some implementations, the water plate forms a side or portion of the heat exchange chamber 110 such that the liquid within the heat exchange chamber 110 directly contacts the water plate.

Water heated within the heat exchange chamber 110 is then pumped to a radiator 113 via a heated liquid channel 114. The heated liquid channel 114 is another insulated pipe, tube, or other sealed channel for delivering the heated cooling liquid to the radiator 113. The radiator 113 cools the heated cooling liquid and dissipates the stored heat. For example, heat from the heated cooling liquid transfers to fins of the radiator 113 and dissipated via fans. The cooling liquid that has been cooled by the radiator is then returned to the pump via a return channel 116.

The chassis base 100 also includes one or more pedestal structures 118. The pedestal structures 118 extend from a surface of the chassis base 100 and house a thermal interface 112. For example, the top of a pedestal structure 118 includes a hole or opening to the internal cavity 104 of the chassis base 100. The thermal interface 112 is housed within the hole of the pedestal structure 118, providing a thermally conductive surface to which components of a computing device are thermally coupled. For example, in some implementations, the thermal interface 112 rests or is mounted on top of the pedestal structure 118, functionally serving as a lid or seal for the hole in the pedestal structure 118. As another example, in other implementations, the thermal interface 112 is aligned with a top or rim of the pedestal structure 118 formed by the hole such that the thermal interface 112 is substantially coplanar to the rim of the hole of the pedestal structure 118. The pedestal structures 118 extend from the surface of the chassis base 100 such that a component, when mounted or installed in the chassis base 100, makes contact with the thermal interface 112 or thermal interface material filling air gaps between the component and the thermal interface 112.

Though FIG. 1 shows a chassis base 100 with a single pedestal structure 118 and thermal interface 112, one skilled in the art will appreciate that the particular configuration of cooling elements, pedestal structures 118 and thermal interfaces 112 is customizable and variable depending on the particular configurations of computing devices implementing the chassis base 100 and according to various engineering concerns. For example, in some implementations, the chassis base 100 will include multiple pedestal structures 118 and thermal interfaces 112. In some implementations, such pedestal structures 118 and thermal interfaces 112 are extensions of a same cooling element. In other implementations, such pedestal structures 118 and thermal interfaces 112 are extensions of different cooling elements.

For example, assume that a mobile computing device includes an APU and a discrete Graphics Processing Unit (GPU). Further assume that an APU die package and a GPU die package each must be thermally coupled to a cooling element in order to dissipate their generated heat. In some implementations, the APU die package and GPU die package are each thermally coupled to separate thermal interfaces 112, thereby providing thermal coupling to the same or separate cooling elements. In other implementations, the APU die package and GPU die package are coupled to a same thermal interface 112. For example, assume that the APU die package and GPU die package have a same height when installed in the computing device. In such an example, the APU die package and GPU die package are able to contact a same thermal interface 112 of a same, unbroken plane of conductive material.

One skilled in the art will also appreciate that, though the cooling element of the chassis base 100 is shown as a liquid cooling system, one skilled in the art will appreciate that cooling elements including different or additional components are also contemplated within the scope of the present disclosure. For example, in an alternative implementation, a vapor chamber is housed in the internal cavity 104 instead of the depicted components of the liquid cooling system. A thermal interface 112 provides a thermal coupling to the vapor chamber, which then dissipates heat from the internal components of the computing device.

By housing a cooling element within the chassis base 100, the internal volume of the chassis that would otherwise be dedicated to cooling elements is made available for other internal components, or for additional cooling elements to improve air flow (e.g., fans and the like). One skilled in the art will appreciate that the cooling provided by the cooling element housed within the chassis base 100 is applicable to a variety of internal components of a computing device, including processors (e.g., an APU, a central processing unit (CPU)), GPUs, memory, or other heat-generating components of a computing device.

Figure 2:
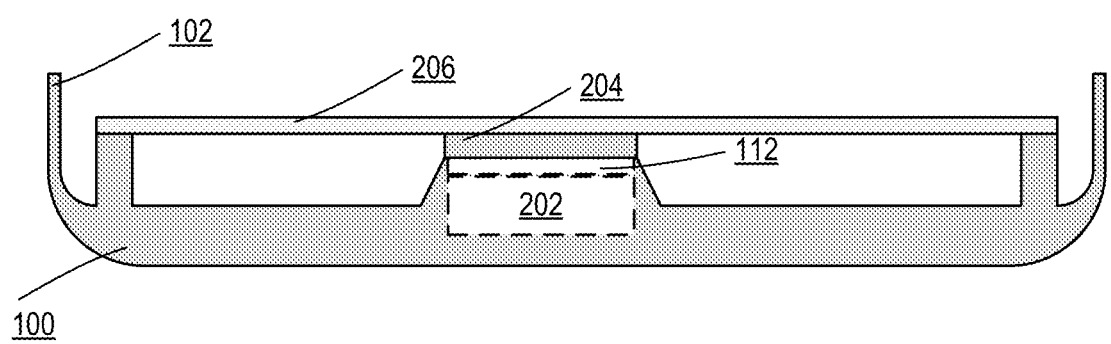
FIG. 2 is a diagram of another example base for a chassis utilized as a common cooling solution for die packages according to some implementations.

For further explanation, FIG. 2 shows another diagram of a chassis base 100 for a chassis as a common cooling solution for die packages according to implementations of the present disclosure. In FIG. 2, a cooling element 202 is housed within an internal cavity of the chassis base 100. In some implementations, the cooling element 202 is similar to the cooling element of FIG. 1 (e.g., a liquid cooling system formed by a pump 106, heat exchange chamber 110, and radiator 113). In other implementations, the cooling element 202 is a different cooling element, such as a vapor chamber, heat sink with fans, heat pipes, or combinations thereof. The cooling element 202 is thermally coupled to a die package 204 via a thermal interface 112. The thermal interface 112 includes, for example, a water plate, a metal contact plate, or other portion of conductive material.

The die package 204 is a die (e.g., a silicon die) mounted to a substrate 206. For example, the die package 204 includes a processing unit such as a CPU or an APU. In such implementations, the substrate 206 includes a printed circuit board (PCB) such as a motherboard. As another example, the die package 204 includes a processor or core of a graphics processing unit (GPU). For example, the die package 204 includes a processor for a discrete graphics processing unit (dGPU) of a mobile computing device. In such implementations, the substrate 206 includes a printed circuit board for the dGPU to which the die is packaged.

In some implementations, the die package 204 is thermally coupled to the thermal interface 112 using one or more portions of thermal interface material. Thermal interface material is a thermally conductive component that fills air gaps between two thermally coupled components. In some implementations, thermal interface material includes thermal pads, thermal grease, or other conductive components as can be appreciated. For example, the thermal interface material is applied to the thermal interface 112 before mounting the substrate 206 to the chassis base 100. After mounting the substrate 206 to the chassis base 100 (e.g., by securing the substrate 206 to mounting points 102 using screws, bolts, pins, and the like) the die package 204 contacts the thermal interface material, thereby forming a thermal coupling from the die package 204 to the cooling element 202 via the thermal interface 112. The thermal interface material has less thermal resistance than air, providing a better thermal coupling when compared to air or by direct contact between the thermal interface 112 and the die package 204.

Figure 3:
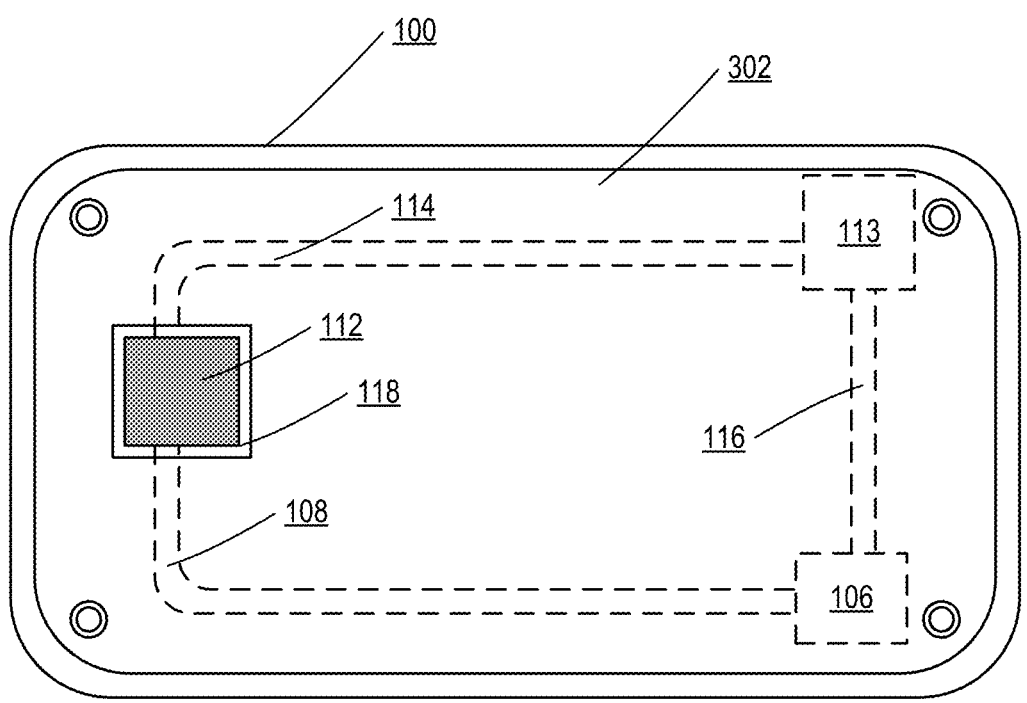
FIG. 3 is a diagram of an overhead view of an example base for a chassis utilized as a common cooling solution for die packages according to some implementations.

For further explanation, FIG. 3 shows another diagram of a chassis base 100 of a chassis utilized as a common cooling solution for die packages according to implementations of the present disclosure. FIG. 3 shows an overhead view of the chassis base 100 depicted in FIG. 1. As shown in FIG. 3, a pedestal structure 118 extends from a surface 302 of the chassis base 100. The thermal interface 112 is housed within a hole of the pedestal structure 118, providing a thermally conductive surface for creating thermal couplings to components of a computing device (e.g., processors).

As in FIG. 1, the chassis base 100 of FIG. 3 includes a liquid cooling system as a cooling element housed within an internal cavity 104 of the chassis base 100. Cooling liquid is pumped by a pump 106 to a heat exchange chamber 110 (not shown in this figure) beneath the thermal interface 112 (e.g., a water plate) via a cooling liquid channel 108. Heated cooling liquid travels to a radiator 113 via a heated liquid channel 114. Cooling liquid cooled by the radiator 113 then travels back to the pump 106 via a return channel 116.

Although FIG. 3 shows a liquid cooling system as a cooling element to which the thermal interface 112 is coupled, one skilled in the art will appreciate that the use of other cooling elements are contemplated within the scope of the present disclosure. For example, instead of the liquid cooling system of FIG. 3, a vapor chamber is instead coupled to the thermal interface 112 to dissipate heat provided to the vapor chamber via the thermal interface 112. One skilled in the art will appreciate that the number of pedestal structures 118 and thermal interfaces 112, as well as the placement of such pedestal structures 118 and thermal interfaces 112, is dependent on various design and engineering considerations. Accordingly, a particular arrangement and configuration of pedestal structures 118 and thermal interfaces 112 will depend on the number and positioning of computing device components to be cooled by the cooling element(s) via the thermal interfaces 112. Moreover, the type and arrangement of cooling element(s) housed in the internal cavity 104 will similarly depend on design and engineering considerations, including the number and positioning of computing device components to be cooled.

Figure 4:
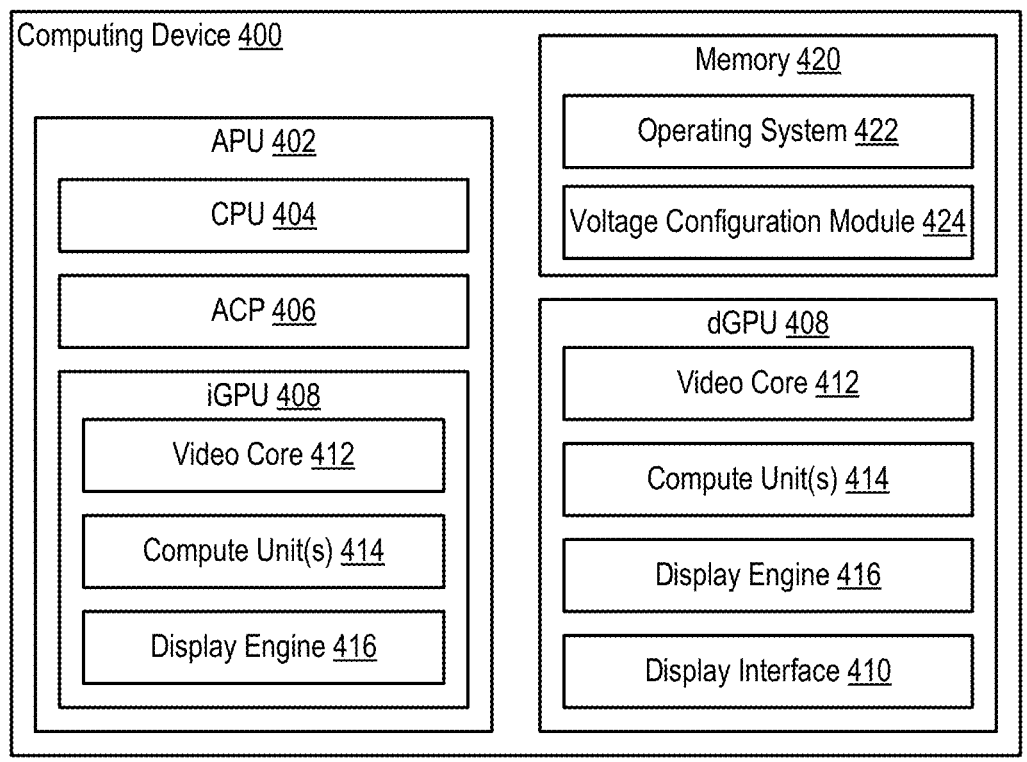
FIG. 4 is a block diagram of an example computing device having a chassis utilized as a common cooling solution for die packages according to some implementations.

FIG. 4 is a block diagram of a non-limiting example computing device 400 having a chassis utilized as a common cooling solution for die packages according to various implementations of the present disclosure. The example computing device 400 can be implemented in a variety of manners including mobile devices, laptop computers, and the like. The computing device 400 includes an APU 402. The APU 402 is a microprocessor that includes a CPU 404 and integrated graphics processing unit (iGPU) 406 on a single die. The computing device 400 also includes a discrete graphics processing unit (dGPU) 408. Although the approaches set forth in this figure are described in the context of a computing device 400 including a dGPU 408 and an APU 402 with an iGPU 406, it is understood that such approaches are also applicable to any system or device incorporating both integrated and discrete GPUs. The dGPU 408 is a peripheral or additional component of the computing device 400 operatively coupled to the APU 402. For example, in some implementations the dGPU 408 is operatively coupled to the APU 402 by a peripheral component interface express (PCIe) bus. Accordingly, in such an implementation, the dGPU 408 is installed in a PCIe port on a motherboard or other printed circuit board (PCB) into which the APU 402 is installed. By virtue of the operable connection between the APU 402 and the dGPU 408, the APU 402 is capable of issuing instructions, rendering jobs, and the like, to the dGPU 408. In some implementations, the dGPU 408 includes a display interface 409. The display interface 409 is a port or socket to which an external monitor or display is connected. The display interface 409 provides a video signal to the external display for presentation. The display interface 409 includes, for example, a High Definition Multimedia Interface™ (HDMI) port, a Video Graphics Array (VGA) port, a Digital Visual Interface (DVI) port, a Universal Serial Bus C (USB-C) port, or other display port as can be appreciated.

The iGPU 406 and dGPU 408 each include one or more video cores 412. A video core 412 is a discrete processing unit, core, or other unit of hardware resources dedicated to encoding and decoding video data. For example, each video core 412 facilitates video encoding or decoding operations such as decoding streaming video content, encoding video for video conferencing applications, encoding video files for later playback, and the like.

The iGPU 406 and dGPU 408 also each include one or more compute units 414. Each compute unit 414 includes one or more cores that share a local cache, allowing for parallel processing and cache access for each core within a given compute unit 414. The compute units 414 facilitate various calculations and processing jobs submitted to the iGPU 406 and dGPU 408, including rendering operations, machine learning operations, and the like.

The iGPU 406 and dGPU 408 also each include a display engine 416. Each display engine 416 manages the presentation of video or image content to a display of the computing device 400 (e.g., an internal mobile device display or an external display coupled to a display interface 410). In some implementations, the display engines 416 implement display core technology. The APU 402 also includes an audio co-processor (ACP) 418. The ACP 418 is a core, processor, or other allocation of hardware components dedicated to audio encoding and decoding.

The computing device 400 also includes memory 420 such as Random Access Memory (RAM). Stored in memory 420 is an operating system 422 and a voltage configuration module 424. The operating system 422 and voltage configuration module 424 in the example of FIG. 4 are shown in memory 420, but many components of such software typically are stored in non-volatile memory also, such as, for example, on a disk drive or other storage medium. Operating systems 422 useful in the computing device 400 according to certain implementations include UNIX™ Linux™, Microsoft Windows™, and others as will occur to those of skill in the art.

The voltage configuration module 424 is a module for controlling the voltage allocated to the APU 402 and dGPU 408. For example, the voltage configuration module 424 allocates voltage in order to increase performance for particular applications. Depending on the particular workload executed in the computing device 400, the voltage configuration module 424 increases or decreases the voltage used by the APU 402 and dGPU 408. As an example, for a workload that relies on the dGPU 408 heavily, such as complex graphics rendering, the voltage configuration module 424 will increase the voltage to the dGPU 408. As another example, for a workload that relies on the APU 402 more than the dGPU 408 such as audio encoding, or when the computing device 400 is in a low power consumption state, the voltage configuration module 424 will increase the voltage to the APU 402. In some implementations, an increase to the voltage of one component (e.g., to the APU 402 and dGPU 408) will cause or be performed in response to a decrease in the voltage of the other component.

In some implementations, a modification to the voltage of a given component will cause or be performed in response to a modification in operating frequency of the given component. For example, assume that a command or request is issued to increase the operating frequency of the dGPU 408 in response to a rendering job being submitted to the dGPU 408. The voltage configuration module 424 will then increase the voltage provided to the dGPU 408 so that the dGPU 408 is able to operate at the increased frequency. In some implementations, the frequency of a given component is defined according to a frequency-voltage curve. A frequency-voltage curve defines a relationship between the frequency of a component and its corresponding voltage. In other words, the frequency-voltage curve defines, for a given frequency, a corresponding voltage for the component.

One skilled in the art will appreciate that the voltage configuration module 424 operates within various constraints for voltages in the computing device 400. For example, in some implementations, the APU 402 and dGPU 408 have defined minimum and maximum safe voltages. One skilled in the art will appreciate that the particular voltage limits for the APU 402 and dGPU 408 are dependent on particular cooling and thermal solutions implemented in the computing device 400.

Figure 5:
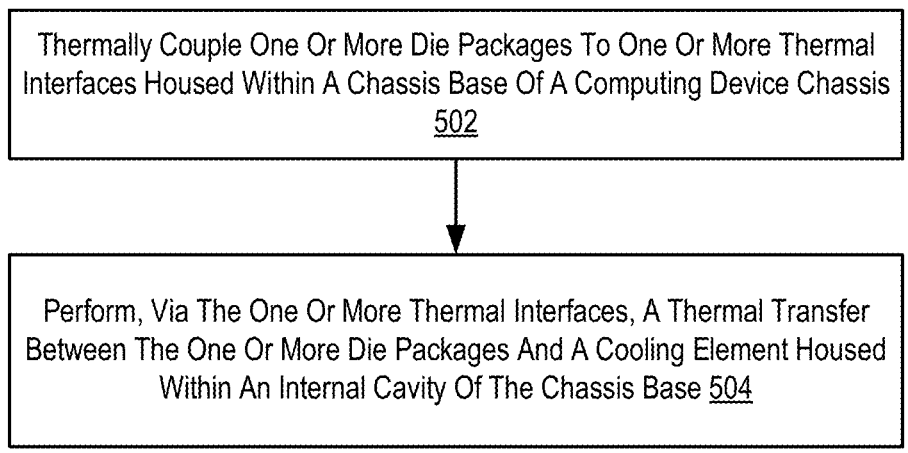
FIG. 5 is a flowchart of an example method of cooling utilizing chassis as a common cooling solution for die packages according to some implementations.

For further explanation, FIG. 5 sets forth a flow chart illustrating an example method of cooling utilizing a chassis as a common cooling solution for die packages according to implementations of the present disclosure. The method of FIG. 5 will be described here with reference to components set forth in previous figures.

The method of FIG. 5 includes thermally coupling 502 one or more die packages 204 to one or more thermal interfaces 112 housed within a chassis base 100 of a computing device chassis. The chassis of a computing device is a case or enclosure that houses the functional components of the computing device, including processing components, peripheral devices, storage devices, memory, power supplies, and the like.

The chassis base 100 is composed of a suitably rigid material to provide protection and stable housing for the internal components of a computing device. For example, the chassis base 100 is composed of a rigid plastic, a metal such as aluminum, or another material as can be appreciated. In some implementations, the chassis base 100 is constructed using a unibody construction surrounding an internal cavity 104 described in further detail below.

The one or more die packages 204 include die packages 204 of the functional components of the computing device. For example, in some implementations, the one or more die packages 204 include a CPU die package 204. As another example, in some implementations, the one or more die packages 204 include an application APU die package. As a further example, in some implementations, the one or more die packages 204 include a dGPU die package 204.

The one or more thermal interfaces 112 are plates or portions of conductive material such as aluminum, copper, or another conductive metal. The thermal interfaces 112 are housed within holes or openings of the chassis base 100 to an internal cavity 104 housing a cooling element. For example, in some implementations, the chassis base 100 includes one or more pedestal structures 118 that extend from a surface 302 of the chassis base 100, with each pedestal structure 118 including a hole or opening for housing the thermal interfaces 112.

The cooling element includes one or more components that transfer or dissipate heat generated by the one or more die packages. For example, the cooling element includes a liquid cooling system, heat sinks, fans, radiators, vapor chambers, heat pipes, similar components, or combinations thereof. The cooling element is housed within an internal cavity 104 of the chassis base 100 and is thermally coupled to the one or more thermal interfaces 112.

In some implementations, the one or more die packages 204 are thermally coupled to the one or more thermal interfaces 112 via direct contact to the thermal interfaces 112. In other implementations, the one or more die packages 204 are thermally coupled to the one or more thermal interfaces 112 by contact with a thermal interface material. The thermal interface material is a conductive material that fills air gaps between two thermally coupled components. For example, the thermal interface material includes thermal paste, thermal pads, and the like. As the thermal interface material has less conductive resistance compared to air, the thermal interface material provides better thermal transfer between the thermally coupled components.

In some implementations, the one or more die packages 204 are thermally coupled to the one or more thermal interfaces 112 by coupling or mounting a substrate 206 to which the die package 204 is bonded to the chassis base 100. For example, in some implementations, the substrate 206 is mounted directly to the chassis base 100. As another example, in some implementations, the substrate 206 is mounted to a skeleton structure or other internal structural component that is coupled to the chassis base 100.

In some implementations, the one or more die packages 204 includes multiple die packages 204. For example, the one or more die packages 204 includes an APU die package 204 and a dGPU die package 204. Accordingly, in some implementations, each of the die packages 204 is thermally coupled to a different thermal interface 112. In some implementations, each thermal interface 112 is thermally coupled to a same cooling element. In other implementations, each thermal interface 112 is thermally coupled to different, independently operating cooling elements. In some implementations, each of the die packages 204 is thermally coupled to a same thermal interface 112 and is therefore thermally coupled to a same cooling element. For example, where the APU die package 204 and dGPU die package 204 have a same height on installation, both the APU die package 204 and dGPU die package 204 will contact a same thermal interface 112 if the thermal interface 112 has suitable surface area.

The method of FIG. 5 also includes performing 504, via the one or more thermal interfaces 112, a thermal transfer between the one or more die packages 204 and a cooling element housed within an internal cavity 104 of the chassis base 100. As is set forth above, the thermal interfaces 112 provide a conductive pathway to the cooling element housed in the internal cavity 104 of the chassis base 100. During operation of the computing device, the one or more die packages 204 generate heat that travels to the cooling element via the thermal interfaces 112 by virtue of the thermal coupling. The cooling element then distributes or dissipates the heat from the one or more die packages 204, thereby cooling the one or more die packages 204 and increasing the maximum safe operational voltages for the die packages 204.

In view of the explanations set forth above, readers will recognize that there many possible benefits of a chassis that is implemented as a common cooling solution for die packages. One potential benefit, for example, includes improved performance of a computing system by freeing internal space used by cooling elements by moving the cooling elements to internal cavities of a chassis base and providing space for additional components.

Exemplary implementations of the present disclosure are described largely in the context of a fully functional computer system for a chassis as a common cooling solution for die packages. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary implementations described in this specification are oriented to software installed and executing on computer hardware, nevertheless, alternative implementations implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some implementations, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A chassis for common cooling of die packages of a computing device, the chassis further comprising:
    a chassis base, including:
        an internal cavity within the chassis base;
        a cooling element housed entirely in the internal cavity, wherein the cooling element comprises one of a radiator and a heatsink; and
        one or more thermal interfaces to the cooling element.

2. The chassis of claim 1, wherein the cooling element comprises a liquid-cooled cooling element.

3. The chassis of claim 2, wherein the one or more thermal interfaces comprise a water plate.

4. The chassis of claim 1, wherein the chassis base comprises a unibody chassis base, and wherein the chassis base further includes a second cooling element housed entirely in the internal cavity.

5. The chassis of claim 1, wherein the chassis base further comprises one or more pedestal structures and the one or more thermal interfaces are housed in one or more portions of the internal cavity in the one or more pedestal structures.

6. The chassis of claim 1, wherein the one or more thermal interfaces are thermally coupled to one or more die packages.

7. The chassis of claim 6, wherein the one or more die packages comprise an application processing unit (APU) die package.

8. The chassis of claim 6, wherein the one or more die packages comprise a discrete graphics processing unit (dGPU) die package.

9. The chassis of claim 6, wherein the one or more thermal interfaces are thermally coupled to the one or more die packages via one or more portions of thermal interface material.

10. A mobile computing device with a common cooling solution, the mobile computing device comprising:
    a plurality of die packages; and
    a chassis having a chassis base, the chassis base comprising an internal cavity within the chassis base, a cooling element housed entirely in the internal cavity, and one or more thermal interfaces to the cooling element, wherein the cooling element comprises one of a radiator and a heatsink, and
    wherein at least one of the plurality of die packages is located within the internal cavity of the chassis base and is thermally coupled to the cooling element through at least one of the one or more thermal interfaces.

11. The mobile computing device of claim 10, wherein the cooling element comprises a liquid-cooled cooling element.

12. The mobile computing device of claim 11, wherein the one or more thermal interfaces comprise a water plate.

13. The mobile computing device of claim 10, wherein the chassis base comprises a unibody chassis base.

14. The mobile computing device of claim 10, wherein the chassis base further comprises one or more pedestal structures and the one or more thermal interfaces are housed in one or more portions of the internal cavity in the one or more pedestal structures.

15. The mobile computing device of claim 10, wherein the at least one of the plurality of die packages comprise a central processing unit (CPU) die package.

16. The mobile computing device of claim 10, wherein the at least one of the plurality of die packages comprise an application processing unit (APU) die package.

17. The mobile computing device of claim 10, wherein the at least one of the plurality of die packages comprise a discrete graphics processing unit (dGPU) die package.

18. The mobile computing device of claim 10, wherein the one or more thermal interfaces are thermally coupled to one or more die packages via one or more portions of thermal interface material.

19. A method for utilizing a chassis as a common cooling solution for die packages comprising:
    thermally coupling one or more die packages to one or more thermal interfaces housed within a chassis base of a computing device chassis; and
    performing, via the one or more thermal interfaces, a thermal transfer between the one or more die packages and a cooling element housed entirely within an internal cavity included within the chassis base, wherein the cooling element comprises one of a radiator and a heatsink.

20. The method of claim 19, wherein the chassis base further comprises one or more pedestal structures and the one or more thermal interfaces are housed in one or more portions of the internal cavity in the one or more pedestal structures.

* * * * *